United States Patent
Egelhof et al.

(10) Patent No.: US 11,368,015 B2
(45) Date of Patent: Jun. 21, 2022

(54) PROCESS FOR TESTING THE OPERABILITY OF A CIRCUIT BREAKER DEVICE

(71) Applicant: Eberspächer Controls Landau GmbH & Co. KG, Landau (DE)

(72) Inventors: André Egelhof, Hochspeyer (DE); Kenneth Midtgaard Pedersen, Kuppenheim (DE)

(73) Assignee: EBERSPÄCHER CONTROLS LANDAU GMBH & CO. KG, Landau (DE)

( * ) Notice: Subject to any disclaimer, the term of this patent is extended or adjusted under 35 U.S.C. 154(b) by 311 days.

(21) Appl. No.: 16/696,440

(22) Filed: Nov. 26, 2019

(65) Prior Publication Data

US 2020/0169077 A1    May 28, 2020

(30) Foreign Application Priority Data

Nov. 28, 2018    (DE) .................... 10 2018 130 034.4

(51) Int. Cl.
*H03K 17/06* (2006.01)
*H03K 17/081* (2006.01)
(Continued)

(52) U.S. Cl.
CPC ......... *H02H 7/205* (2013.01); *G01R 31/3274* (2013.01); *G01R 31/3275* (2013.01);
(Continued)

(58) Field of Classification Search
CPC ............. H03K 2017/066; H03K 17/06; H03K 17/08104; H02H 1/0007; G08B 21/185;
(Continued)

(56) References Cited

U.S. PATENT DOCUMENTS 9,739,823 B2 * 8/2017 Schmauss ............... G01R 31/52
10,770,883 B2 * 9/2020 Creech ............. H03K 17/04123
(Continued)

FOREIGN PATENT DOCUMENTS

DE     102017107160 A1    10/2018
DE     102017109785 A1    11/2018
(Continued)

OTHER PUBLICATIONS

DE 10 2017 109 785 A1. The reference discloses a method for checking the operability of a circuit breaker arrangement. The reference is attached. No translation is available to Applicant at this time, however, attached is an English language abstract.
(Continued)

*Primary Examiner* — Sisay G Tiku
(74) *Attorney, Agent, or Firm* — McGlew and Tuttle, P.C.

(57) ABSTRACT

A process tests an operability of a circuit breaker device (18, 20, 34) to establish/sever a connection of two circuit areas (36, 38, 40, 42). The circuit breaker device includes a MOSFET (44) with a source terminal (46) connected with a circuit area, a drain terminal (48) connected with a circuit area, and a gate terminal (50) with a gate voltage applied by an associated gate driver device (52) to switch into a connection switching state connecting the two circuit areas during a connection phase. The gate voltage is monitored during the connection phase, a base voltage being applied to the source terminal or/and to the drain terminal during the connection phase is monitored. If a difference between the gate voltage and the base voltage falls below a predefined reference difference during the connection phase, it is determined that a circuit defect is present in the MOSFET.

12 Claims, 2 Drawing Sheets

(51) Int. Cl.
  *H02H 1/00* (2006.01)
  *G01R 31/327* (2006.01)
  *H02H 7/20* (2006.01)
  *G08B 21/18* (2006.01)
(52) U.S. Cl.
  CPC ......... *G08B 21/185* (2013.01); *H02H 1/0007* (2013.01); *H03K 17/08104* (2013.01)
(58) Field of Classification Search
  CPC ............ G01R 31/3274; G01R 31/3275; G01R 31/3277
  See application file for complete search history.

(56) References Cited

U.S. PATENT DOCUMENTS

2015/0160285 A1* 6/2015 Joh ..................... G01R 31/2621
                                                              324/754.03
2016/0344178 A1* 11/2016 Wortberg ............. G01R 31/007
2018/0284193 A1* 10/2018 Wan .................... G01R 31/3277
2019/0038100 A1* 2/2019 Lee ........................... A47L 5/14
2020/0099374 A1* 3/2020 Ebbinghaus ....... H03K 17/0822
2021/0031636 A1* 2/2021 Stogiannos ............... B60L 1/00
2021/0257676 A1* 8/2021 Takahashi ........ G01R 19/16576

FOREIGN PATENT DOCUMENTS

EP       2107673 A1 * 10/2009 ......... H03K 17/0822
EP       3503343 A1 *  6/2019 ........... H01H 47/002
WO  WO-2020099575 A1 *  5/2020 ............... H02H 3/08

OTHER PUBLICATIONS

DE 10 2017 107 160 A1. The reference discloses a device and method for testing the switching state of a circuit breaker device. The reference is attached. No translation is available to Applicant at this time, however, attached is an English language abstract.

* cited by examiner

PROCESS FOR TESTING THE OPERABILITY OF A CIRCUIT BREAKER DEVICE

CROSS REFERENCE TO RELATED APPLICATIONS

This application claims the benefit of priority under 35 U.S.C. § 119 of German Application 10 2018 130 034.4, filed Nov. 28, 2018, the entire contents of which are incorporated herein by reference.

TECHNICAL FIELD

The present invention pertains to a process for testing the operability of a circuit breaker device to establish/sever a connection of two circuit areas, for example, in a vehicle.

TECHNICAL BACKGROUND

Such circuit breaker devices are especially used in the onboard power supply systems in vehicles in order to separate circuit areas from one another as a function of the operating state of a vehicle, in order to avoid disadvantageous interaction, or to establish such a connection, for example, in order to be able to charge all batteries which are present in such circuit areas or power supply areas and are utilized as d.c. voltage sources. Such circuit breaker devices may also be used to couple circuit areas provided or operating redundantly with one another in vehicles which are operated electrically and are configured especially for autonomous driving.

Such circuit breaker devices generally comprise one or more MOSFET (metal-oxide-semiconductor field-effect transistor) circuit components that are connected parallel or/and in series to one another, which are coupled with their respective source terminal to one of the circuit areas to be connected to one another or to be separated from one another and are coupled with their respective drain terminal to the other of the circuit areas to be connected to one another or to be separated from one another.

In order to guarantee that circuit defects cannot lead to safety-relevant compromises of the driving operation especially in such circuit breaker devices, especially in vehicles, which utilize assistance systems assisting a driver or are configured for autonomous driving, it is necessary to monitor such circuit breaker devices in regard to their functionality. In particular, there is a risk in case of semi-conductor circuit components, for example, MOSFET circuit components, that a thermal overload will lead to damage, in which case the drain and the source are permanently electrically connected to one another and a defined separation of the circuit areas coupled to these is no longer reliably possible.

SUMMARY

An object of the present invention is to provide a process for testing the operability of a circuit breaker device to establish/sever a connection of two circuit areas, especially in a vehicle, with which process the presence of a circuit defect can be detected in a simple, yet reliable manner.

This object is accomplished according to the present invention by a process for testing the operability of a circuit breaker device to establish/sever a connection of two circuit areas, especially in a vehicle, wherein the circuit breaker device comprises at least one MOSFET circuit component, wherein a source terminal of the at least one MOSFET circuit component is in connection with one of the circuit areas and a drain terminal of the at least one MOSFET circuit component is in connection with the other circuit area, and wherein a gate driver device is associated with the at least one MOSFET circuit component for applying a gate voltage to a gate terminal of the at least one MOSFET circuit component to switch the circuit breaker device into a connection switching state connecting the two circuit areas to one another, wherein the process comprises the steps:

A) switching of the circuit breaker device into a connection switching state connecting the two circuit areas to one another by applying a gate voltage to the gate terminal of the at least one MOSFET circuit component during a connection phase, B) monitoring of the gate voltage during the connection phase, C) monitoring of a base voltage being applied to the source terminal or/and to the drain terminal during the connection phase, and D) if a difference between the gate voltage and the base voltage falls below a predefined reference difference during the connection phase, deciding that a circuit defect is present in at least one MOSFET circuit component of the circuit breaker device.

The present invention is based on the finding that a defect leading to a permanent electrical connection between a source terminal and a drain terminal of a MOSFET circuit component generally also leads to a corresponding electrical connection between the gate terminal and the source terminal or/and the drain terminal. The result of such an electrical connection is that an excessive flow of current occurs between the gate and the source or/and the drain because of the circuit defect during a connection phase, i.e., during an operating phase, in which an electrically conductive connection between the source terminal and the drain terminal shall be brought about in a defined manner by applying the gate voltage. The result of such an excessive flow of current is, in turn, that the gate driver device cannot maintain the gate voltage to be applied to the gate terminal during the connection phase to establish the conductive connection between the source terminal and the drain terminal and a marked voltage drop or voltage dip occurs. By monitoring the gate voltage in regard to the occurrence of such a voltage drop or voltage dip, it can also be detected whether a circuit defect leading to an excessive flow of current between the gate and the source or/and the drain, which is an indicator of the presence of a corresponding defect in the area between the source and the drain, is present in the circuit breaker device in case of an established connection of the circuit areas and thus, for example, during the driving operation of a vehicle. If such an excessive voltage drop or voltage dip is detected, the presence of a circuit defect can be inferred.

The process according to the present invention can especially advantageously be applied if the gate driver device comprises a boost converter, which is generally also called a boost regulator. Such boost regulators respond with a voltage drop in their output voltage in case of the occurrence of an excessive flow of current and thus make it possible to be able to detect the presence of a circuit defect in a reliable manner by monitoring the gate voltage.

In order to guarantee that voltage fluctuations, which possibly occur, e.g., as a function of the load state, cannot lead to an incorrect decision in regard to the presence of a circuit defect, it is proposed that an input voltage, which is below the base voltage by a predefined first voltage difference, be generated by the gate driver device based on the base voltage being applied or to be applied to the source terminal or/and to the drain terminal and an output voltage, which is above the input voltage by a predefined second voltage difference and is to be applied to the gate terminal as a gate voltage, be generated by the gate driver device based on the input voltage, and that the output voltage be compared with the base voltage in step D).

To detect a circuit defect, a reference voltage which is above the base voltage can be defined by the predefined reference difference, and the gate voltage can be compared with the reference voltage in step D). It can be decided that a circuit defect is present if the gate voltage is below the reference voltage.

Especially if the process according to the present invention is used in the area of an onboard power supply system of a vehicle, the safety provided by this process in case of the detection of a circuit defect can especially advantageously be used if a voltage source, preferably a d.c. voltage source or/and at least one electrical energy consumer, is associated with at least one circuit area, preferably with each circuit area.

In order to avoid the occurrence of potentially critical driving situations in the presence of a circuit defect of the circuit breaker device, a safety switching action can be taken if it is decided in step D) that a circuit defect of the circuit breaker device is present. Such a safety action may comprise, for example, the ending of the connection phase or/and thus the ending of the application of the gate voltage. In addition or as an alternative thereto, such a safety action may comprise the generation of a safety warning or/and the controlled ending of the driving operation of a vehicle.

The present invention will be described below with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF PREFERRED EMBODIMENTS

Figure 1:
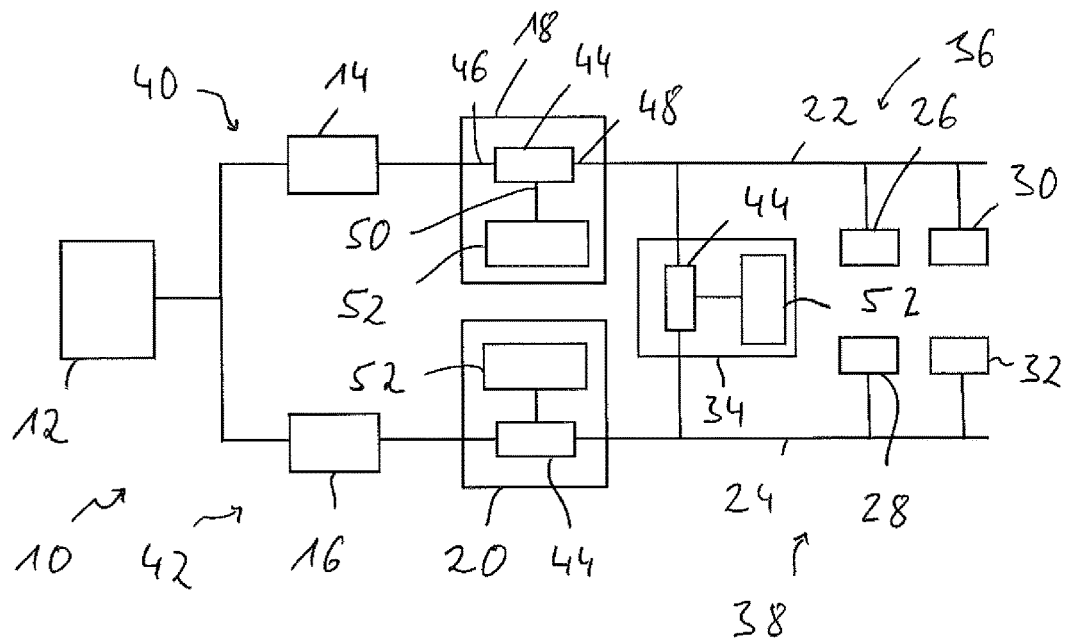
FIG. 1 is a schematic diagram of an onboard power supply system of a vehicle with a circuit breaker device.

Referring to the drawings, an onboard power supply system of a vehicle is generally designated by 10 in FIG. 1. This onboard power supply system 10, which is configured, for example, for a vehicle driven by an electric motor, comprises a high-voltage battery 12, which can be charged by connecting to a charging station. The electrical voltage provided by the high-voltage battery 12 may be in the range of about 400 V. Two d.c./d.c. converters 14, 16, which are configured to reduce the voltage supplied by the high-voltage battery 12 to a value in the range of, for example, about 12 V to 14 V, are connected to the high-voltage battery 12. A circuit breaker device 18, 20 is connected to each of the d.c./d.c. converters 14, 16. Power supply areas 22, 24 can be coupled with the d.c./d.c. converter 14 or with the d.c./d.c. converter 16 by the circuit breaker devices 18, 20 in order to be able to charge low-voltage batteries, for example, lithium batteries 26, 28 present in these power supply areas 22, 24 or to feed electrical energy consumers 30, 32, which are provided in the power supply areas 22, 24 and are suggested only symbolically. An additional circuit breaker device 34 is arranged between the two power supply areas 22, 24 and can thus also establish a direct connection between same, so that each power supply area 22, 24 can basically be fed by the voltage provided by each of the two d.c./d.c. converters 14, 16.

By providing the three circuit breaker devices 18, 20, 34 in the onboard power supply system 10 shown in FIG. 1, different circuit areas to be connected to one another or to be separated from one another are defined by these circuit breaker devices 18, 20,34. Thus, each of the power supply areas 22, 24 forms a circuit area 36, 38. These two circuit areas 36, 38 may be connected to one another or be uncoupled from one another by the circuit breaker device 34. Correspondingly, each d.c./d.c. converter 14 or 16 defines a circuit area 40, 42 or is associated with same. The circuit area 40 provided by the d.c./d.c. converter 14 or comprising same can be connected to the circuit area 36 comprising the power supply area 22 or/and to the circuit area 38 comprising the power supply area 24. The circuit area 42 provided by the d.c./d.c. converter 16 or comprising same can be connected to the circuit area 38 comprising the power supply area 24 or/and to the circuit area 36 comprising the power supply area 22.

It should be stressed at this point that the onboard power supply system 10 being shown in FIG. 1 is only an example of a plurality of configurations that are very different in terms of construction or in terms of circuitry, in which different circuit areas are to be connected to one another or uncoupled from one another by circuit breaker devices. Such circuits comprising a plurality of circuit areas may, as already mentioned, advantageously be used in vehicles, especially in vehicles operated with an electric motor or/and intended for autonomous driving operation, but they may, of course, also be used in other fields of application.

Each of the circuit breaker devices 18, 20, 34 comprises at least one MOSFET circuit component 44. The MOSFET circuit component 44 shown, for example, in the context of the circuit breaker device 18 comprises a source terminal 46, which is in connection with the d.c./d.c. converter 14, i.e., with the circuit area 40, and comprises a drain terminal 48, which is in connection with the power supply area 22, i.e., with the circuit area 36. The MOSFET circuit component 44 further comprises a gate terminal 50, which is in connection with a gate driver device 52. By applying a gate voltage to the gate terminal 50, the MOSFET circuit component 44 is switched into its conductive state, in which there is a low-resistance connection between the source terminal 46 and the drain terminal 48 and thus the two circuit areas 40, 36 are connected to one another in an electrically conductive manner.

It should be pointed out that each of the circuit breaker devices 18, 20, 34 may, of course, have a plurality of MOSFET circuit components connected in series or/and parallel to one another, which may all be under the actuation of the respectively associated gate driver device, so that by applying a gate voltage, which is generated by the gate driver device, to the gate terminals of all MOSFET circuit components of a respective circuit breaker device, all MOSFET circuit components can be simultaneously connected in a conductive manner.

Figure 2:
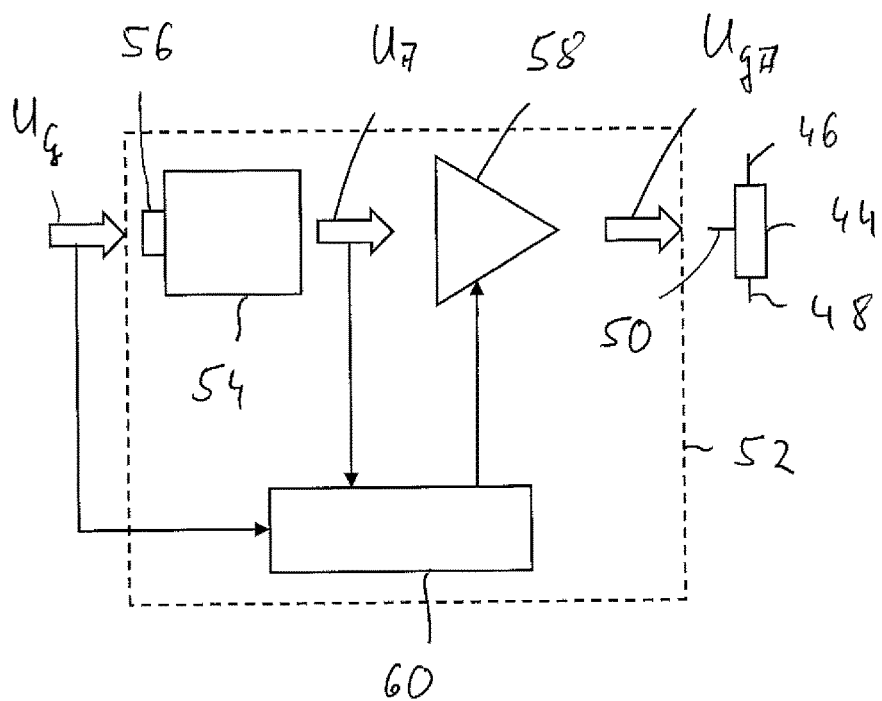
FIG. 2 is a schematic view of a configuration of a gate driver device.
Figure 3:
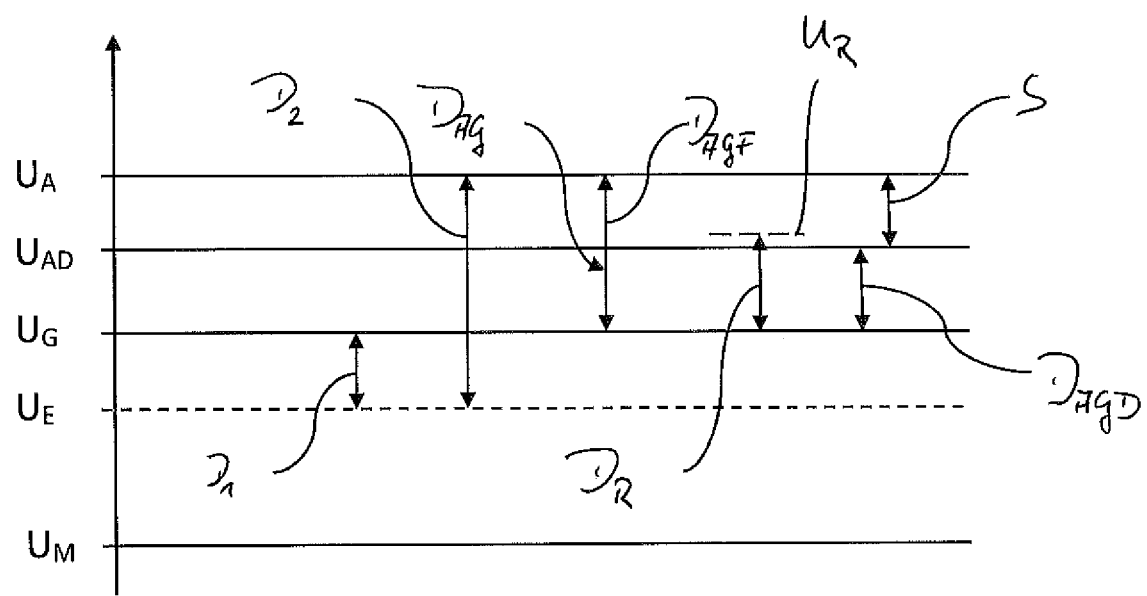
FIG. 3 is a diagram showing voltage levels occurring during the operation of an onboard power supply system.

With reference to FIGS. 2 and 3, it will be described how the gate voltage is generated by means of such a gate driver device and is applied to the MOSFET circuit component or to the respective associated MOSFET circuit components and how such a circuit breaker device comprising one or more MOSFET circuit components and an associated gate driver device can be monitored for the presence of a circuit defect in at least one of the MOSFET circuit components according to the principles of the present invention.

FIG. 2 shows such a gate driver device 52 in a schematic diagram. The gate driver device 52 comprises a boost converter 54, which is generally also called a boost regulator. Such a boost converter 54 is configured to increase or to boost an input voltage applied to same by a predefined difference. As is shown in FIG. 2, an input voltage generation circuit 56 is arranged upstream of the boost converter 54. The d.c. voltage generated by each of the two d.c./d.c. converters 14 and 16 is applied as base voltage $U_G$ to this input voltage generation circuit 56. As already mentioned, this d.c. voltage may be, for example, in the range of 12 V to 14 V. In case of use in a vehicle, the base voltage $U_G$ may be called onboard power supply, with which the different electrical energy consumers can also be fed.

The input voltage generation circuit 56 reduces the base voltage $U_G$ by a predefined first voltage difference $D_1$, for example, by about 5 V, in order to thus provide an input voltage $U_E$ for the boost converter 54. If the base voltage $U_G$ is, for example, 14 V, the result is that the input voltage $U_E$ is about 9 V for the boost converter 54.

The boost converter 54 increases this input voltage $U_E$ by a predefined second voltage difference $D_2$, which may be, for example, 18 V, and thus generates an output voltage $U_A$, which is above the input voltage $U_E$ by this predefined second voltage difference, which means that the output voltage $U_A$ is about 27 V in the example mentioned above This output voltage $U_A$ of the boost converter 54 is applied to a driver 58, which is under the actuation of an actuating unit 60, which is configured, for example, as a microcontroller. The actuating unit 60 generates actuating commands for the driver 58, so that upon generation of corresponding actuating commands for the driver 58 of same, the output voltage $U_A$ of the boost converter 54 or a voltage essentially corresponding to this output voltage $U_A$ is applied as gate voltage $U_{GA}$ to the gate terminal 50 of an associated MOSFET circuit component 44 or possibly a plurality of such MOSFET circuit components 44.

The actuating unit 60 is in connection with a higher-level control system that provides information to the actuating unit 60 when a gate voltage $U_{GA}$ is to be applied to the MOSFET circuit component or to the respectively associated MOSFET circuit components 44 for providing a connection phase, so that the actuating unit 60 generates corresponding actuating commands for the associated driver 58 corresponding to this information. For this purpose, the actuating unit 60 may be configured in terms of circuitry or/and be equipped with corresponding actuating programs in order to generate the actuating command for the driver 58 triggering the application of the output voltage $U_A$ as gate voltage $U_{GA}$ to the gate terminal 50 or to the gate terminals 50 based on the information fed to this actuating unit 60 at the given time.

As further shown in FIG. 2, the actuating unit 60 is fed information about the base voltage $U_G$ or the output voltage $U_A$ generated by the boost converter 54 via corresponding voltage detection units. It should be pointed out that, as an alternative or in addition, information about voltages that correspond to these voltages $U_G$ and $U_A$ can be fed to the actuating unit 60. For example, the voltage generated as input voltage for the boost converter 54 or reduced by the voltage difference $D_1$ by the input voltage generation circuit 56 voltage or/and a voltage directly reflecting the gate voltage $U_{GA}$ being applied to the respective gate terminal 50 could also be fed to the actuating unit 60.

Based on the voltage information that is available to the actuating unit 60, this actuating unit may monitor the MOSFET circuit component or the MOSFET circuit components 44 to be actuated by the driver 58 for the presence of a circuit defect. Such a circuit defect may arise in the form of a permanent, electrically conductive connection between the source terminal 46 and the drain terminal 48 due to thermal overload in the case of highly loaded circuit components. If the source terminal 46 and the gate terminal 48 are connected to one another in an electrically conductive manner due to internal damage of a MOSFET circuit component 44, this is generally also associated with the fact that a corresponding, permanent, electrically conductive, low-resistance connection develops between the gate terminal 50 and the source terminal 46 or/and the drain terminal 48. The result of such a conductive connection between the gate terminal 50 or/and the drain terminal 48 is a flow of current from the gate terminal 50 into the source terminal 46 or/and the drain terminal 48, which flow of current does not, in principle, occur in an operable MOSFET circuit component 44. The boost converter 54 is, in principle, not configured for such flows of current or responds to such a flow of current with a marked drop in the output voltage $U_A$ generated by this boost converter, which leads to a corresponding drop in the gate voltage $U_{GA}$ applied to the gate terminal 50 during a connection phase.

The actuating unit 60 is able to monitor the difference $D_{AG}$ existing, in principle, between these two voltages by feeding the actuating unit 60 information about the base voltage $U_G$ and the output voltage $U_A$ or voltages clearly corresponding thereto. Assuming a correct functionality of the MOSFET circuit component or of the MOSFET circuit components 44, this voltage difference $D_{AG}$ is, in principle, independent of the level of the base voltage $U_G$ or of fluctuations of the base voltage $U_G$, since shiftings of the base voltage $U_G$ lead to a corresponding shifting of the input voltage $U_E$ and accordingly also of the output voltage $U_A$. If, however, a voltage drop S of the output voltage $U_A$ and accordingly also of the gate voltage $U_{GA}$, which may generally be in the range of about 600 mV to 800 mV, triggered by a circuit defect in one or more of the MOSFET circuit components 44 occurs, this voltage drop S is not represented in the base voltage $U_G$. Rather, the output voltage $U_A$ of the boost converter 54 is shifted by an extent corresponding to the voltage drop S to an output voltage $U_{AD}$, which is then present for a circuit defect. Accordingly, the difference between the base voltage $U_G$ and the gate voltage $U_{GA}$ being applied to the gate terminal 50 also decreases to a difference $D_{AGD}$. The difference $D_{AGD}$ and the transition from the difference $D_{AGF}$ present for an operable state to the difference $D_{AGD}$ then present in case of a circuit defect arising in case of the occurrence of a circuit defect can be analyzed and can be used as an indicator of the presence or the occurrence of a circuit defect upon initiating a connection phase or during a connection phase. For example, this voltage difference $D_{AGD}$ can be compared directly with a reference difference $D_R$, and if the reference difference $D_R$ is greater than the difference $D_{AGD}$ that is actually present, the presence of a circuit defect is inferred. If an expected voltage drop S is, for example, in the range of 600 mV to 800 mV, then the reference difference can be defined such that it is above the difference $D_{AGD}$ to be expected for a circuit defect, taking into consideration the voltage drop S, by, for example, 100 mV to 200 mV. If the difference $D_{AGF}$ is about 13 V for the example explained above as, for example, for an operable state, this means that the difference $D_{AGD}$ that is then still present for a circuit defect in case of a voltage drop of 600 mV to 800 mV is in the range of 12.2 V to 12.4 V. The reference difference $D_R$ may then be set, for example, at 12.5 V to 12.6 V. It is possible, as an alternative, to define a reference voltage $U_R$, taking such a reference difference $D_R$ into account, and to compare this reference voltage $U_R$ directly with the output voltage $U_{AD}$ then generated in the presence of a circuit defect and the occurrence of the voltage drop S.

If it is detected that such a circuit defect occurs in a circuit breaker device, the actuating unit 60 may send corresponding circuit defect information to a higher-level control system, for example, of a vehicle. This higher-level control system can be configured to take different safety actions. Thus, for example, a display or an acoustic signal can be generated which indicates the occurrence of such a defect to the operator of a system, i.e., for example, to the driver of a vehicle. It is also possible to end the connection phase by ending the application of the gate voltage $U_{GA}$ to the gate terminal or the gate terminals 50. It is further possible to bring the drive to an end in a controlled manner, i.e., for example, in principle, to permit the continuation of the drive until the vehicle comes to a stop or is parked, by applying this process in a vehicle if this vehicle is in the driving state. If this takes place, a resumption of the driving operation can be prevented and thus the performance of a repair can be imposed. Of course, additional or other safety actions may also be taken as a function of the operating environment.

It is possible with the process according to the present invention to detect the presence of a circuit defect of one or more MOSFET circuit components on the basis of information that is present in a circuit system anyway, especially in the area of a gate driver device, especially also during the operation, i.e., especially in case of an established connection, in which one or more MOSFET circuit components are connected in a low-resistance manner, i.e., in a conductive state. The process described above may, of course, be carried out in case of the configuration of an onboard power supply system 10 shown in FIG. 1 in connection with each of the circuit breaker devices 18, 20, 34 shown there, each as a function of the operation of the other circuit breaker devices.

Finally, it should be stressed again that, as explained above, to detect a defect of a MOSFET circuit component, especially the base voltage that is also being applied to the source terminal of same can be compared directly with the output voltage of the boost converter. The monitoring or comparison of these voltages with one another can equally be achieved by voltages, which are clearly correlated with these voltages, for example, the input voltage of the boost converter generated from the base voltage or the gate voltage essentially corresponding to the output voltage of the boost converter, being compared or being the basis of the decision in regard to the presence of a defect.

While specific embodiments of the invention have been shown and described in detail to illustrate the application of the principles of the invention, it will be understood that the invention may be embodied otherwise without departing from such principles.

What is claimed is:

1. A process for testing the operability of a circuit breaker device to establish or to sever a connection of two circuit areas, the process comprising the steps of:

providing the circuit breaker device comprising a gate driver device and a MOSFET circuit component with a source terminal in connection with one of the circuit areas and a drain terminal in connection with another of the circuit areas and a gate terminal wherein the gate driver device is associated with the MOSFET circuit component for applying a gate voltage to the gate terminal of the MOSFET circuit component for switching the circuit breaker device into a connection switching state connecting the two circuit areas to one another;

switching the circuit breaker device into the connection switching state connecting the two circuit areas to the one another by applying the gate voltage to the gate terminal of the MOSFET circuit component during a connection phase;

monitoring the gate voltage during the connection phase;

monitoring of a base voltage being applied to the source terminal or/and being applied to the drain terminal during the connection phase; and determining if a difference between the gate voltage and the base voltage falls below a predefined reference difference during the connection phase, to determine that a circuit defect is present in the MOSFET circuit component of the circuit breaker device.

2. The process for testing in accordance with claim 1, wherein the gate driver device comprises a boost converter.

3. The process for testing in accordance with claim 1, wherein:

an input voltage, which is below the base voltage by a predefined first voltage difference, is generated by the gate driver device based on the base voltage being applied or to be applied to the source terminal or/and to the drain terminal; and an output voltage, which is above the input voltage by a predefined second voltage difference and which is to be applied to the gate terminal as the gate voltage, is generated by the gate driver device based on the input voltage; and the output voltage is compared with the base voltage in said step of determining.

4. The process for testing in accordance with claim 1, wherein:

a reference voltage, which is above the base voltage, is defined by the predefined reference difference; and the gate voltage is compared with the reference voltage in said step of determining, and it is determined that the circuit defect is present if the gate voltage is below the reference voltage.

5. The process for testing in accordance with claim 1, wherein at least one of the circuit areas comprises a voltage source or/and at least one electrical energy consumer.

6. The process for testing in accordance with claim 1, wherein if it is determine that the circuit defect is present in the MOSFET circuit component of the circuit breaker device, a safety switching action is taken.

7. The process for testing in accordance with claim 6, wherein the safety switching action comprises:

an ending of the connection phase; or the generation of a safety warning; or the controlled ending of a driving operation of a vehicle provided with the circuit breaker device; or any combination of an ending of the connection phase, and a generation of a safety warning, and a controlled ending of a driving operation of a vehicle provided with the circuit breaker device.

8. The process for testing in accordance with claim 1, wherein the circuit breaker device comprises at least another MOSFET circuit component to provide the circuit breaker device with a plurality of MOSFET circuit components connected in series or/and parallel to the one another, wherein the plurality of MOSFET circuit components is under actuation of the gate driver device.

9. The process for testing in accordance with claim 8, wherein the gate driver device comprises a boost converter.

10. The process for testing in accordance with claim 1, wherein the circuit breaker device is provided in a vehicle comprising the two circuit areas.

11. A process for testing the operability of a circuit breaker device to establish or to sever a connection of two circuit areas, the process comprising the steps of:
- providing the circuit breaker device comprising a gate driver device and a MOSFET circuit component with a source terminal in connection with one of the circuit areas and a drain terminal in connection with another of the circuit areas and a gate terminal wherein the gate driver device is associated with the MOSFET circuit component for applying a gate voltage to the gate terminal of the MOSFET circuit component for switching the circuit breaker device into a connection switching state connecting the two circuit areas to one another;
- switching the circuit breaker device into the connection switching state connecting the two circuit areas to the one another by applying the gate voltage to the gate terminal of the MOSFET circuit component during a connection phase;
- monitoring the gate voltage during the connection phase;
- monitoring of a base voltage being applied to the source terminal or/and being applied to the drain terminal during the connection phase; and
- determining if a difference between the gate voltage and the base voltage falls below a predefined reference difference during the connection phase, to determine that a circuit defect is present in the MOSFET circuit component of the circuit breaker device, wherein:
- an input voltage, which is below the base voltage by a predefined first voltage difference, is generated by the gate driver device based on the base voltage being applied or to be applied to the source terminal or/and to the drain terminal;
- an output voltage, which is above the input voltage by a predefined second voltage difference and which is to be applied to the gate terminal as the gate voltage, is generated by the gate driver device based on the input voltage; and
- the output voltage is compared with the base voltage in said step of determining.

12. A process for testing the operability of a circuit breaker device to establish or to sever a connection of two circuit areas, the process comprising the steps of: providing the circuit breaker device comprising a gate driver device and a MOSFET circuit component with a source terminal in connection with one of the circuit areas and a drain terminal in connection with another of the circuit areas and a gate terminal wherein the gate driver device is associated with the MOSFET circuit component for applying a gate voltage to the gate terminal of the MOSFET circuit component for switching the circuit breaker device into a connection switching state connecting the two circuit areas to one another; switching the circuit breaker device into the connection switching state connecting the two circuit areas to the one another by applying the gate voltage to the gate terminal of the MOSFET circuit component during a connection phase; monitoring the gate voltage during the connection phase; monitoring of a base voltage being applied to the source terminal or/and being applied to the drain terminal during the connection phase; determining if a difference between the gate voltage and the base voltage falls below a predefined reference difference during the connection phase, to determine that a circuit defect is present in the MOSFET circuit component of the circuit breaker device, wherein: a reference voltage, which is above the base voltage, is defined by the predefined reference difference; and the gate voltage is compared with the reference voltage in said step of determining, and it is determined that the circuit defect is present if the gate voltage is below the reference voltage.

\* \* \* \* \*